(12) United States Patent
Bonin et al.

(10) Patent No.: US 6,593,163 B1
(45) Date of Patent: Jul. 15, 2003

(54) DOUBLE-SIDED TRENCH FILL FOR ELECTRICAL ISOLATION OF MICROELECTROMECHANICAL SYSTEM STRUCTURES

(75) Inventors: Wayne A. Bonin, North Oaks, MN (US); Zine-Eddine Boutaghou, Vadnais Heights, MN (US); Roger L. Hipwell, Jr., Eden Prairie, MN (US); Barry D. Wissman, Eden Prairie, MN (US); Lee Walter, Plymouth, MN (US); Barbara J. Ihlow-Mahrer, Crystal, MN (US)

(73) Assignee: Seagate Technology, Scotts Valley, CA (US)

( * ) Notice: Subject to any disclaimer, the term of this patent is extended or adjusted under 35 U.S.C. 154(b) by 401 days.

(21) Appl. No.: 09/707,475

(22) Filed: Nov. 7, 2000

Related U.S. Application Data

(60) Provisional application No. 60/194,813, filed on Apr. 5, 2000.

(51) Int. Cl.[7] .......................... H01L 21/00; H01L 21/76
(52) U.S. Cl. ...................... 438/50; 438/424; 438/437
(58) Field of Search .............................. 438/50–53, 424, 438/427, 425, 435–438

(56) References Cited

U.S. PATENT DOCUMENTS

| | | | | |
|---|---|---|---|---|
| 5,599,744 A | * | 2/1997 | Koh et al. | 437/195 |
| 5,681,444 A | * | 10/1997 | Azzaro et al. | 205/125 |
| 5,915,190 A | | 6/1999 | Pirkle | 438/424 |
| 6,358,762 B1 | * | 3/2002 | Kohno et al. | 438/17 |
| 6,458,696 B1 | * | 10/2002 | Gross | 438/668 |

FOREIGN PATENT DOCUMENTS

JP   406260757 A   *   9/1994

* cited by examiner

Primary Examiner—John F. Niebling
Assistant Examiner—Viktor Simkovic
(74) Attorney, Agent, or Firm—Kinney & Lange, P.A.

(57) ABSTRACT

A method for filling a trench extending through a microelectromechanical system (MEMS) device patterned on a wafer is disclosed. The method involves simultaneously depositing a trench-fill layer of insulating material over a first side of the wafer, over a second side of the wafer, and into the trench extending from the first side to the second side. Further, the width of the trench at the first side of the wafer and/or the second side of the wafer is variable to adjust the rate at which the trench fills.

20 Claims, 9 Drawing Sheets

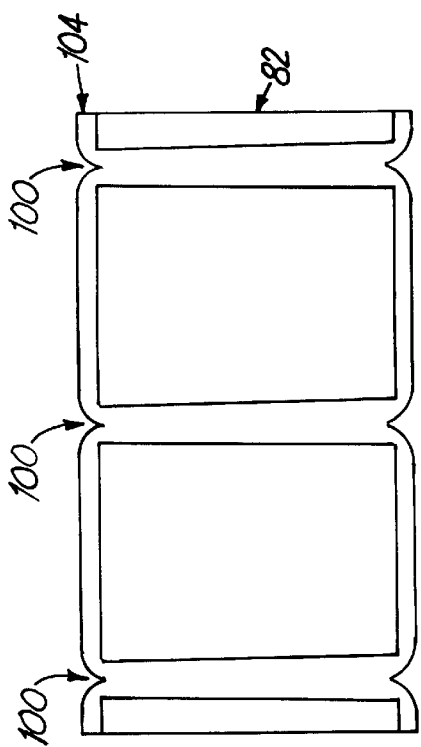
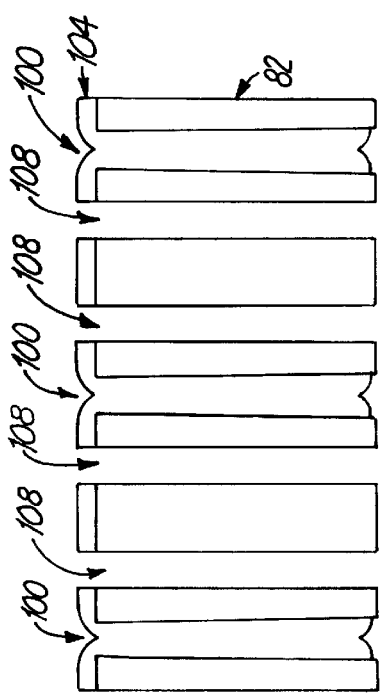
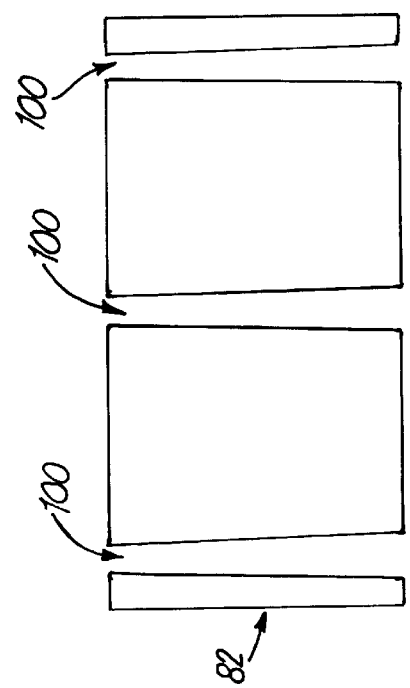
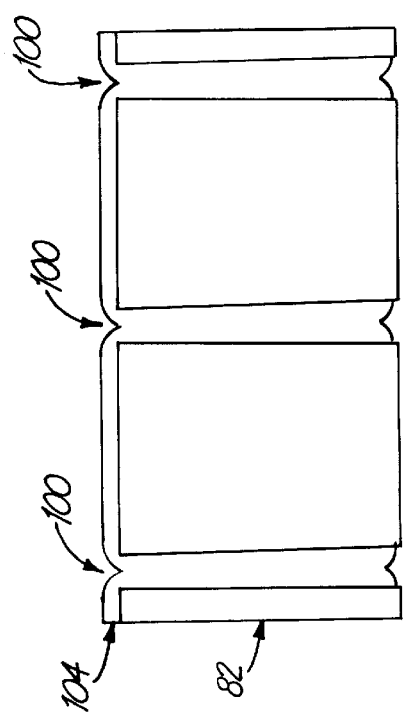

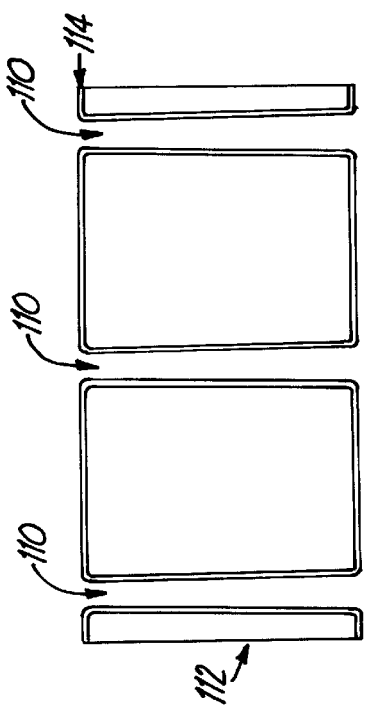
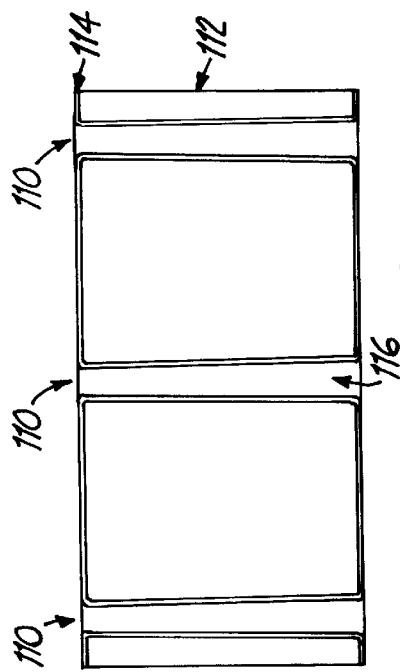
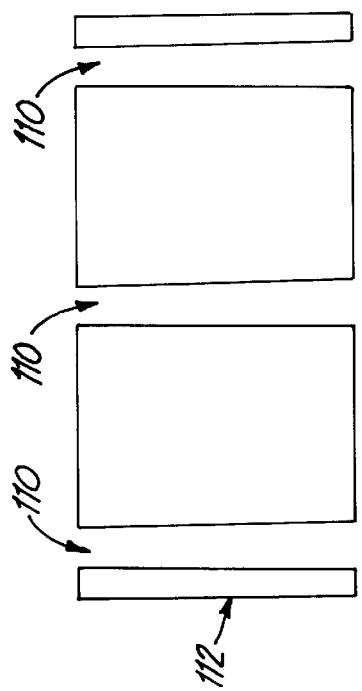
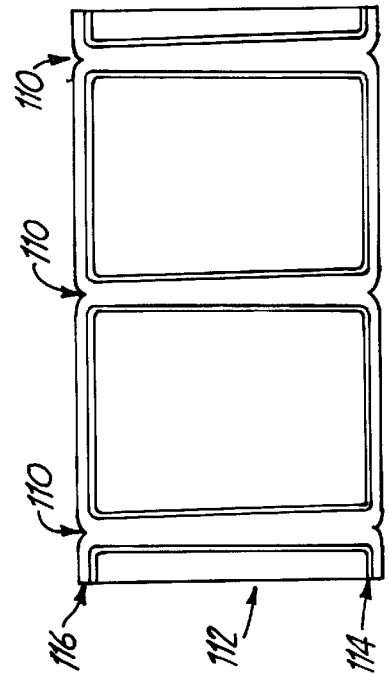

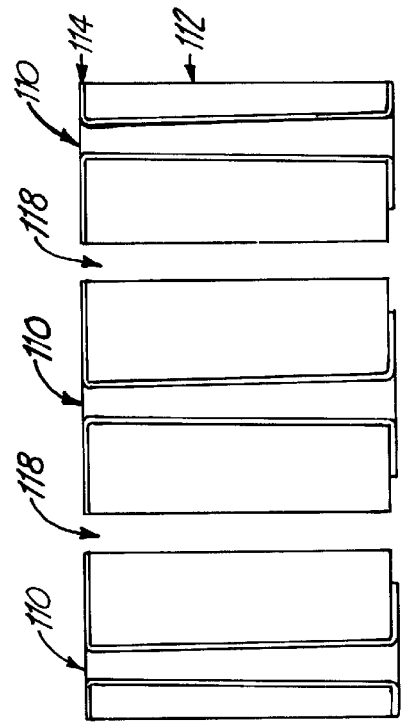
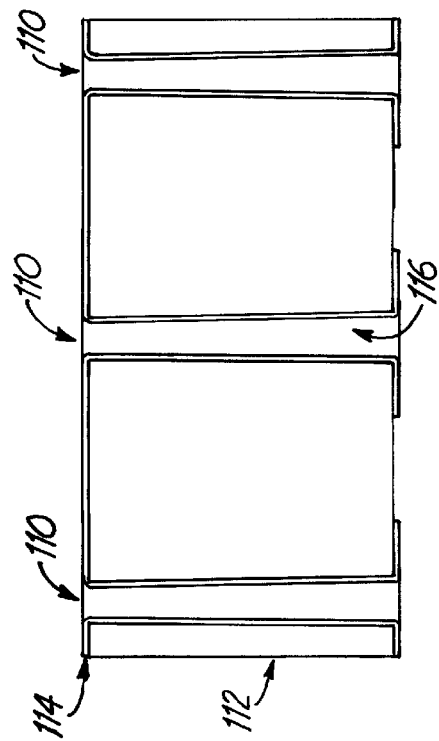

DOUBLE-SIDED TRENCH FILL FOR ELECTRICAL ISOLATION OF MICROELECTROMECHANICAL SYSTEM STRUCTURES

CROSS-REFERENCE TO RELATED APPLICATION(S)

This application claims priority from Provisional Application No. 60/194,813 filed Apr. 5, 2000, for "Double Sided Trench Fill For Electrical Isolation Of MEMS Structures" by W. Bonin, Z. Boutaghou, R. Hipwell, B. Wissman, L. Walter, and B. Ihlow-Mahrer.

BACKGROUND OF THE INVENTION

The present invention relates generally to microelectromechanical system (MEMS) devices, and more particularly to a method of electrically isolating MEMS device structures utilizing isolation trenches filled from both sides of a silicon product wafer.

Many MEMS devices require the fabrication of electrically isolated, mechanically connected structures. One approach to realizing these structures is through the use of insulator-filled isolation trenches. Under this approach, trenches separating high-aspect ratio MEMS structures are deep-trench reactive-ion etched through the wafer being employed for fabricating the-MEMS device. After the trenches are etched, they are filled with an insulating material such as silicon nitride. This electrically isolates the MEMS structures from one another while maintaining a mechanical connection.

However, conventional methods of filling isolation trenches have significant problems with the mechanical integrity of the fill. For example, as isolation trenches are filled according to these conventional methods, insulating material accumulates at the trench openings faster than at the trench bottoms. This results in a small void near the bottom of the isolation trenches, jeopardizing the mechanical integrity of the final device. These small voids form because conventional methods of trench filling permit insulating material to be deposited from only one side of the product wafer. Accordingly, there is a need for a method to ensure uniform filling of high-aspect ratio isolation trenches.

BRIEF SUMMARY OF THE INVENTION

The present invention is a method for filling a trench extending through a microelectromechanical system (MEMS) device patterned on a wafer. The method involves simultaneously depositing a trench-fill layer of insulating material over a first side of the wafer, over a second side of the wafer, and into the trench extending from the first side to the second side. Further, the width of the trench at the first side of the wafer and/or the second side of the wafer is variable to adjust the rate at which the trench fills.

BRIEF DESCRIPTION OF THE DRAWINGS

FIG. 7a is a cross-section view showing the first step of fabricating electrically isolated MEMS device structures according to a second embodiment of the present invention.

FIG. 7b is a cross-section view showing the second step of fabricating electrically isolated MEMS device structures according to a second embodiment of the present invention.

FIG. 7c is a cross-section view showing the third step of fabricating electrically isolated MEMS device structures according to a second embodiment of the present invention.

FIG. 7d is a cross-section view showing the fourth step of fabricating electrically isolated MEMS device structures according to a second embodiment of the present invention.

FIG. 8a is a cross-section view showing the first step of fabricating electrically isolated MEMS device structures according to a third embodiment of the present invention.

FIG. 8b is a cross-section view showing the second step of fabricating electrically isolated MEMS device structures according to a third embodiment of the present invention.

FIG. 8c is a cross-section view showing the third step of fabricating electrically isolated MEMS device structures according to a third embodiment of the present invention.

FIG. 8d is a cross-section view showing the fourth step of fabricating electrically isolated MEMS device structures according to a third embodiment of the present invention.

FIG. 8e is a cross-section view showing the fifth step of fabricating electrically isolated MEMS device structures according to a third embodiment of the present invention.

FIG. 8f is a cross-section view showing the sixth step of fabricating electrically isolated MEMS device structures according to a third embodiment of the present invention.

DETAILED DESCRIPTION OF THE PREFERRED EMBODIMENTS

In order to fully understand the significance of the present invention, several figures disclosing the context and prior art of the present invention-are first introduced. FIGS. 1, 2a, 2b, 2c, and 2d present a method for filling electrical isolation trenches according to a first prior art method wherein silicon-on-insulator (SOI) wafer handling technology is used. FIGS. 3, 4a, 4b, 4c, and 4d disclose a method for filling electrical isolation trenches according to a second prior art method wherein fusion bonded wafer handling technology is used. The remaining figures, FIGS. 5, 6a, 6b, 6c, 6d, 7a, 7b, 7c, 7d, 8a, 8b, 8c, 8d, 8e, and 8f, disclose three methods of filling electrical isolation trenches according to the present invention.

Figure 1:
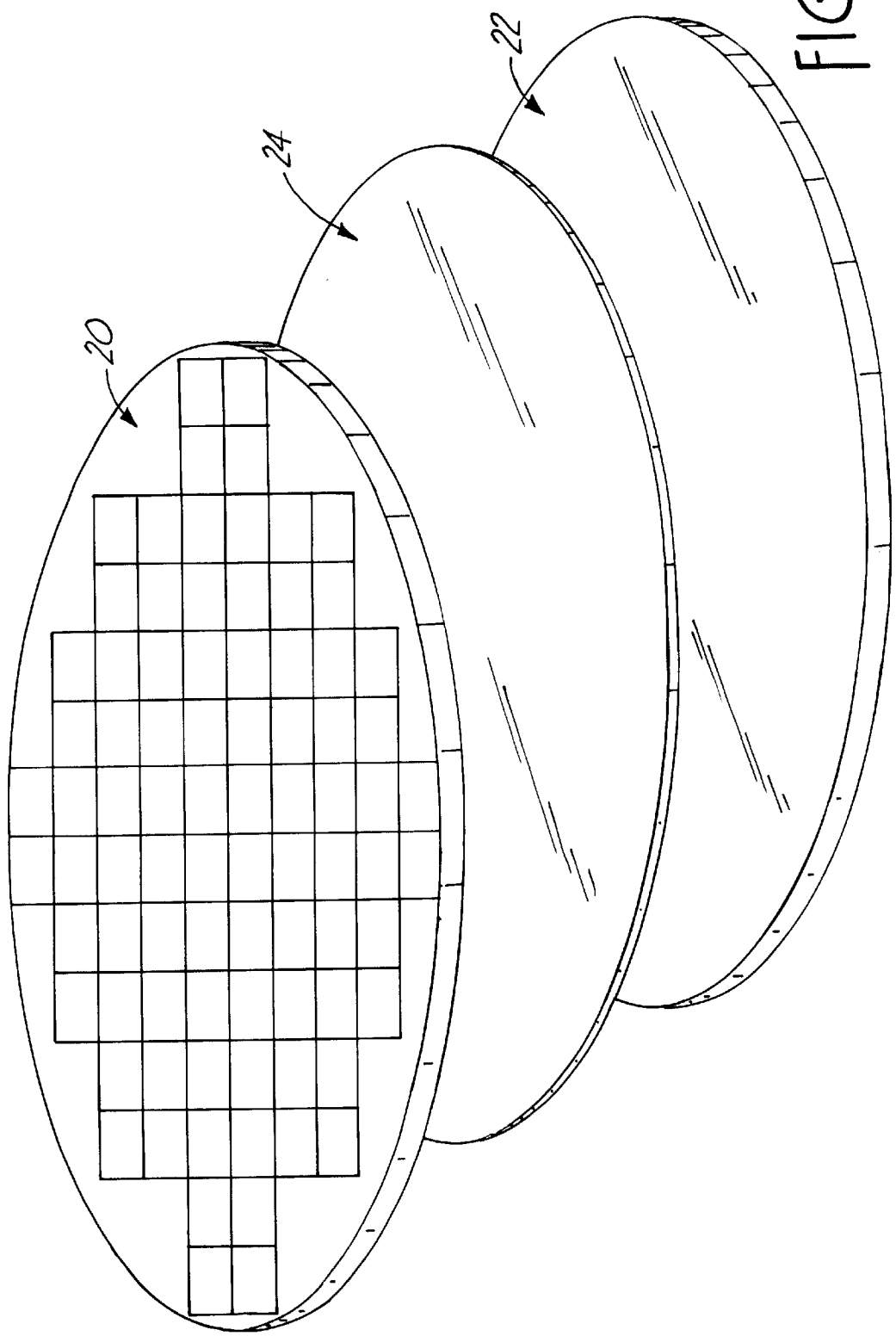
FIG. 1 is a perspective view of electrically isolated MEMS device structures fabricated on a wafer using a silicon-on-insulator (SOI) wafer process according to a first prior art method.

FIG. 1 is a perspective illustration of SOI wafer handling technology, wherein a thin product wafer 20 of the final device thickness is bonded to handle wafer 22 by continuous oxide layer 24.

Figure 2A:
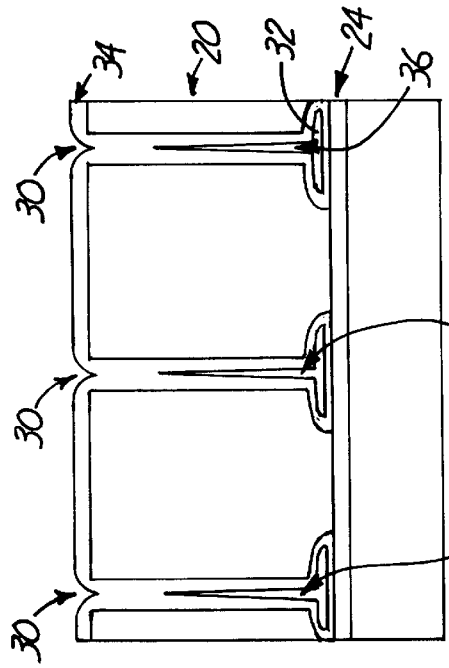
FIG. 2a is a cross-section view showing a first step of fabricating electrically isolated MEMS device structures on a wafer using a SOI wafer process according to a first prior art method.

FIGS. 2a–2d are cross-section views of the wafer configuration of FIG. 1, showing the steps for fabricating electrically isolated MEMS device structures using a SOI process. As a first step, shown in FIG. 2a, isolation trenches 30 are reactive-ion etched through product wafer 20 to continuous oxide layer 24. Oxide layer 24 acts as an etch stop, such that the accelerated ions of the reactive-ion etch stop at the interface between product wafer 20 and oxide layer 24. However, this approach has significant disadvantages. For example, footing 32 is typically observed at the interface between insulating layer 24 and product wafer 20. This effect is the result of charged ions from the reactive-ion etch gas becoming embedded in insulating layer 24. As the ions build up in insulating layer 24, a charge builds up. As etching ions flow through isolation trenches 30 toward insulating layer 24, the charge in insulating layer 24 repels the etching ions laterally.

Figure 2B:
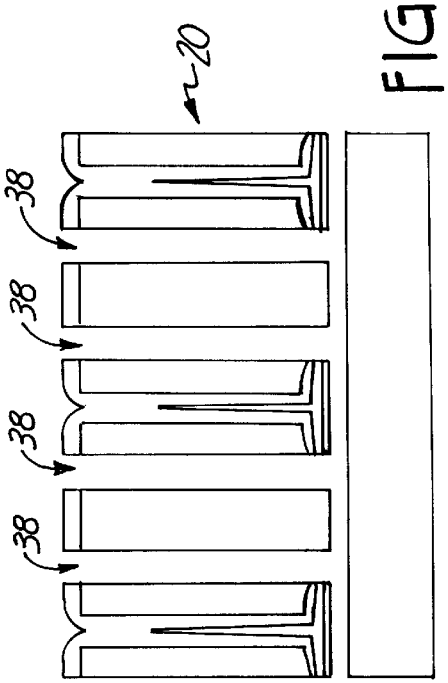
FIG. 2b is a cross-section view showing a second step of fabricating electrically isolated MEMS device structures on a wafer using a SOI wafer process according to a first prior art method.

The lateral spread of footing 32 becomes significant after the trenches are filled with insulating material 34, as shown in FIG. 2b. As insulating material 34 is spread over product wafer 20 and into isolation trenches 30, insulating material 34 builds up at the opening of isolation trenches 30 faster than at the bottom of the trenches. This manifests small voids ("keyholes" 36) near the bottom of isolation trenches 30, resulting in a very thin and weak mechanical connection at the bottom of the trench. Keyholes 36 are manifested even if the walls of isolation trenches 30 are uniformly straight. However, keyholes 36 become even more significant when footing 32 spreads laterally along continuous oxide layer 24, since the area to be covered by insulating material 34 is larger when footing 32 exists at the bottom of the trench. Thus, as the tops of isolation trenches 30 fill with insulating material 34, even larger keyholes 36 remain, resulting in poor mechanical integrity. One proposed solution to this problem (not shown) is to fabricate isolation trenches that are wider at the trench openings than at the trench bottom. However, this introduces another problem. After subsequent process steps, slivers of silicon remain near the bottom of the trench, as the wider trench top shadows the silicon near the bottom of the trench, preventing etching. This is problematic in that these slivers cause short circuits in the final device.

Figure 2C:
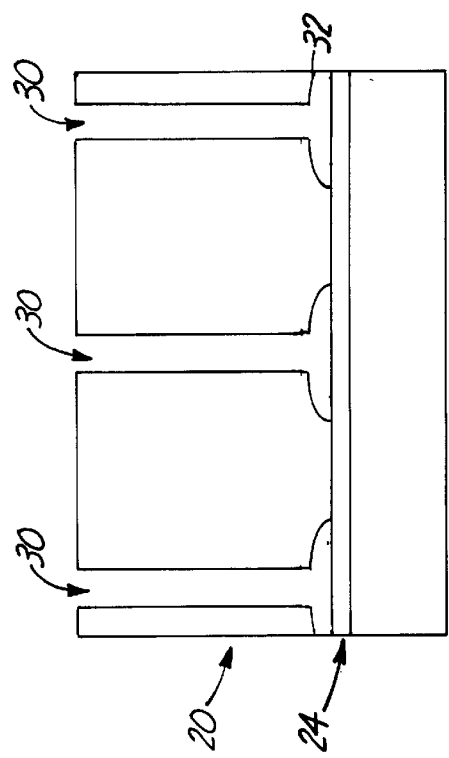
FIG. 2c is a cross-section view showing a third step of fabricating electrically isolated MEMS device structures on a wafer using a SOI wafer process according to a first prior art method.

A second potential problem associated with using SOI technology for handling product wafer 20 is shown in FIG. 2c. As footing 32 spreads laterally along oxide layer 24, it potentially infringes upon areas reserved for trenches 38, which define high-aspect ratio MEMS structures such as a stator electrode on a disc drive microactuator. This is problematic for two reasons. First, as trenches 38 are fabricated, additional etching is required to etch through the infringing insulating material. This is because silicon nitride, a material typically used for filling isolation trenches 30, is highly resistant to the gases used for etching the trenches in the silicon. It should be noted that although there is a potential for a footing effect to occur as trenches 38 are etched, its effect is less serious than that for isolation trenches 30 and is not shown here for clarity. After the device is released, a second problem is introduced. Because insulating material 34 that was coating footing 32 has been removed, no mechanical connection remains at the bottom of isolation trenches 30. This not only jeopardizes the mechanical integrity of the MEMS device, but also leaves an opening at the bottom of isolation trenches 30. On the other hand, if the infringing insulating material is not removed, there will be a weak mechanical connection at the bottom of trenches 38. However, the movement of the MEMS device will be restricted by the insulating material protruding into trenches 38.

Figure 2D:
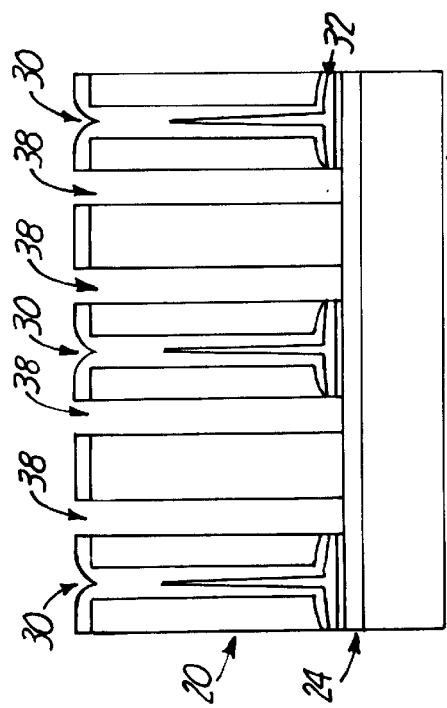
FIG. 2d is a cross-section view showing a fourth step of fabricating electrically isolated MEMS device structures on a wafer using a SOI wafer process according to a first prior art method.

A third problem associated with SOI wafer handling is shown in FIG. 2d. After etching trenches 38, a "release step" is required to remove oxide layer 24 (FIG. 2c) from product wafer 20, thus freeing the completed devices. Oxide layer 24 is typically removed by etching with hydrogen fluoride (HF) or other similar reactive gas or aqueous solution. However, the release step is often extremely undesirable or incompatible with MEMS devices in that added etching can render the devices nonfunctional.

Figure 3:
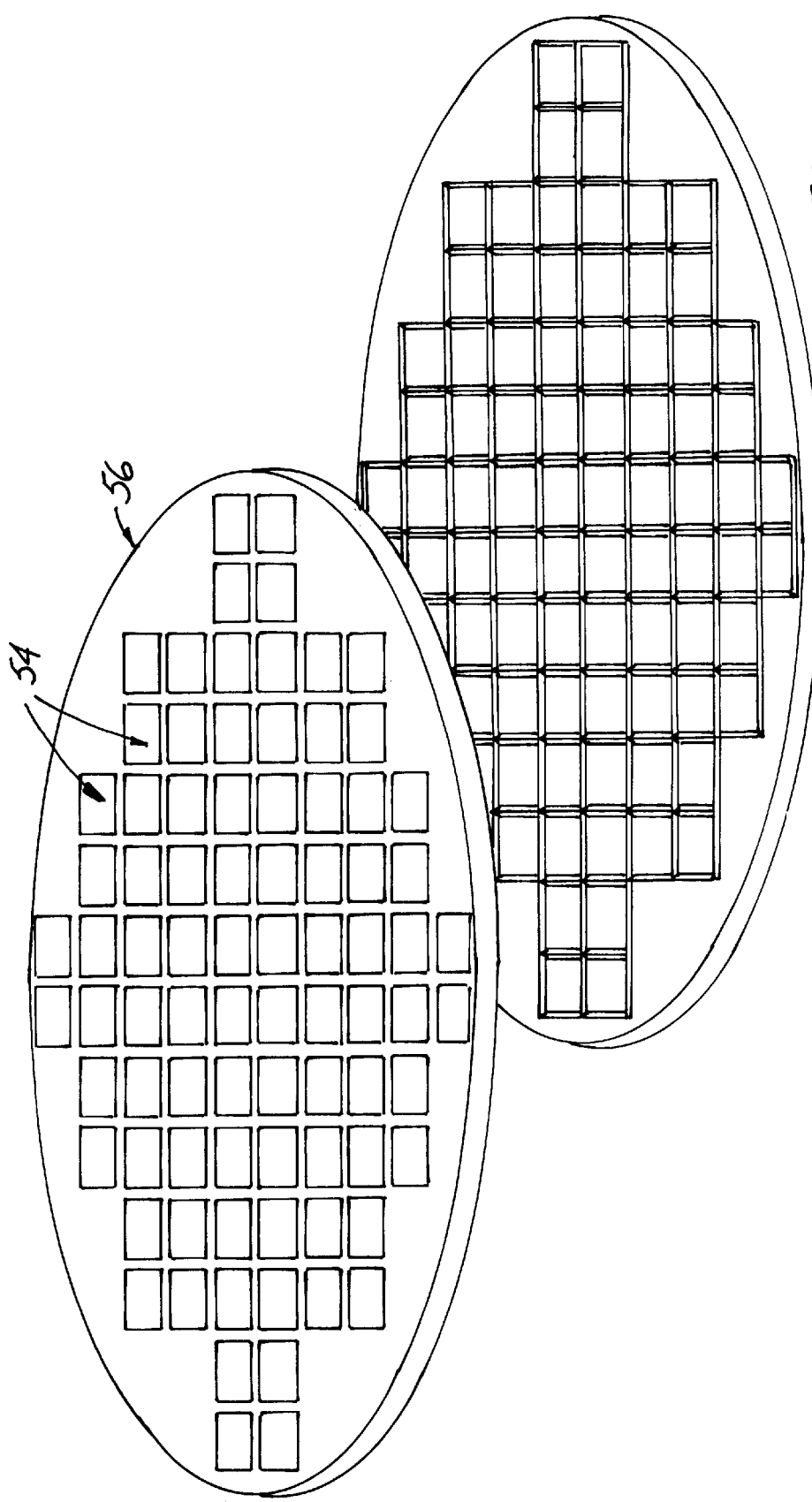
FIG. 3 is a perspective view of a second prior art method of fabricating electrically isolated MEMS device structures on a wafer using a fusion bonded cavity wafer process.

One proposed solution to these problems is to use a fusion bonded wafer handling process, as opposed to SOI wafer handling. FIG. 3 is a perspective illustration of a typical fusion bonded wafer handling process. Silicon fusion bonding involves bonding two silicon wafers to each other to form one structural element. In this prior art example, shallow cavities 50 are etched into a first side of handle wafer 52. Next, product wafer 54 is fusion bonded to the first side of handle wafer 52 at the outer edge of cavities 50. Once handle wafer 52 is bonded to product wafer 54, cavities 50 provide non-bonded support for devices 56 after being released from product wafer 54.

Figure 4A:
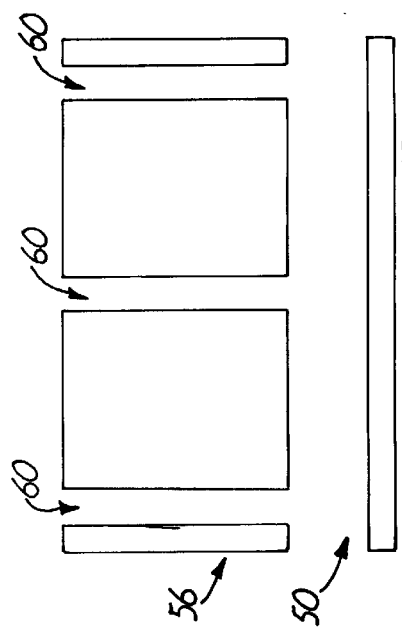
FIG. 4a is a cross-section view showing a first step of fabricating electrically isolated MEMS device structures on a wafer using a fusion bonded cavity wafer process according to a second prior art method.

FIGS. 4a–4d are cross-section views of the wafer configuration of FIG. 3, showing the steps for fabricating electrically isolated MEMS device structures using a fusion bonded wafer handling process. In the first step, shown in FIG. 4a, isolation trenches 60 are reactive-ion etched through product wafer 54 down to cavity 50. This method has an advantage over the previous prior art example (FIGS. 2a–2d) in that no footing occurs as isolation trenches 60 permeate product wafer 56. However, this trench-fill method also has disadvantages.

Figure 4B:
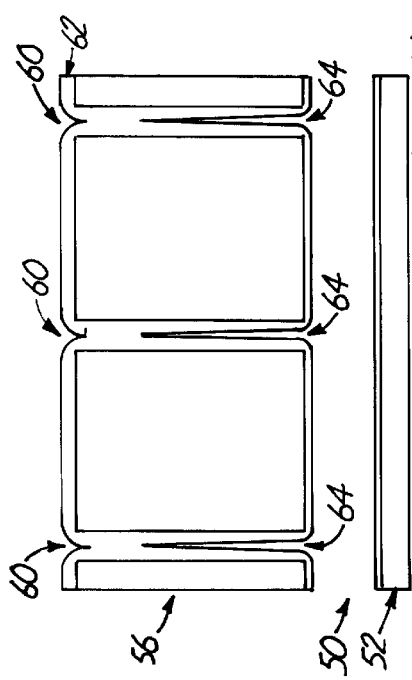
FIG. 4b is across-section view showing a second step of fabricating electrically isolated MEMS device structures on a wafer using a fusion bonded cavity wafer process according to a second prior art method.

FIG. 4b shows the result of the step shown in FIG. 4a after insulating material 62 has been spread over product wafer 54 and into isolation trenches 60. It should be noted that as insulating material 62 is applied to product wafer 54, it not only coats the walls of isolation trenches 60, but also coats the bottom of product wafer 54 and the top of handle wafer 52 (thus coating cavity 50). This becomes significant in subsequent process steps. Furthermore, as was seen in the previous prior art example (FIGS. 2a–2d), isolation trenches 60 fill with insulating material 62 faster at the opening of isolation trenches 60 than at the bottom of the trenches. This again manifests keyholes 64 near the bottom of isolation trenches 60, resulting in a mechanical connection only at the top of the trenches. A solution similar to that in the previous prior art example has been proposed, wherein isolation trenches 60 are fabricated wider at the trench openings than at the trench bottoms. However, this also results in slivers of silicon remaining near the bottom of the trenches after subsequent process steps, as the wider trench top shadows the silicon near the bottom of the trench. This prevents etching of these slivers and is problematic because these slivers cause short circuits in the final device.

Figure 4C:
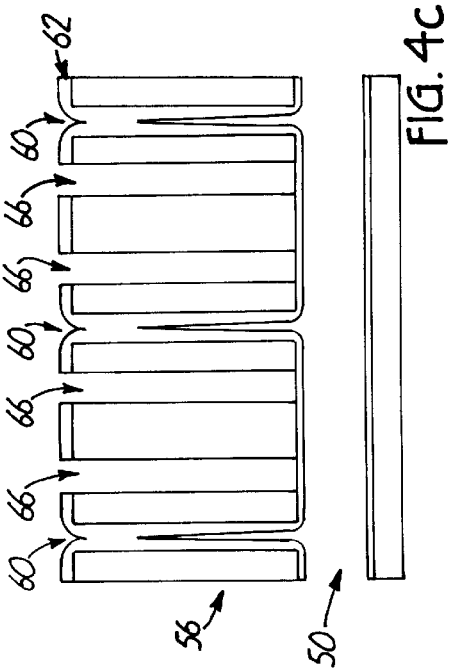
FIG. 4c is a cross-section view showing a third step of fabricating electrically isolated MEMS device structures on a wafer using a fusion bonded cavity wafer process according to a second prior art method.

FIG. 4c shows the results of the step shown in FIG. 4b after trenches 66 defining high-aspect ratio MEMS structures are etched down to insulating material 62 that is coating cavity 50. An exemplary high-aspect ratio MEMS structure is a stator electrode on a disc drive microactuator. Because silicon nitride, a material typically used to fill isolation trenches 60, is less chemically reactive than silicon, etching through insulating material 62 at the bottom of trenches 66 requires additional time.

Figure 4D:
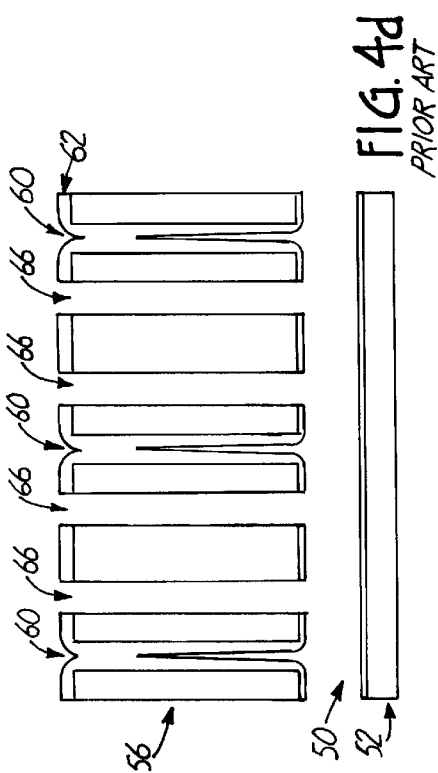
FIG. 4d is a cross-section view showing a fourth step of fabricating electrically isolated MEMS device structures on a wafer using a fusion bonded cavity wafer process according to a second prior art method.

FIG. 4d shows the results of the step shown in FIG. 4c after insulating material 62 has been etched from the bottom of trenches 66 The added time necessary to etch through insulating material 62 is another disadvantage of using fusion bonded handle wafer 52 with cavity 50. Not only does the added etch time impair the efficiency of MEMS device fabrication, but also it jeopardizes the etching uniformity of trenches 66, and may result in a large undercut due to the footing effect described previously for the SOI wafer process.

Figure 5:
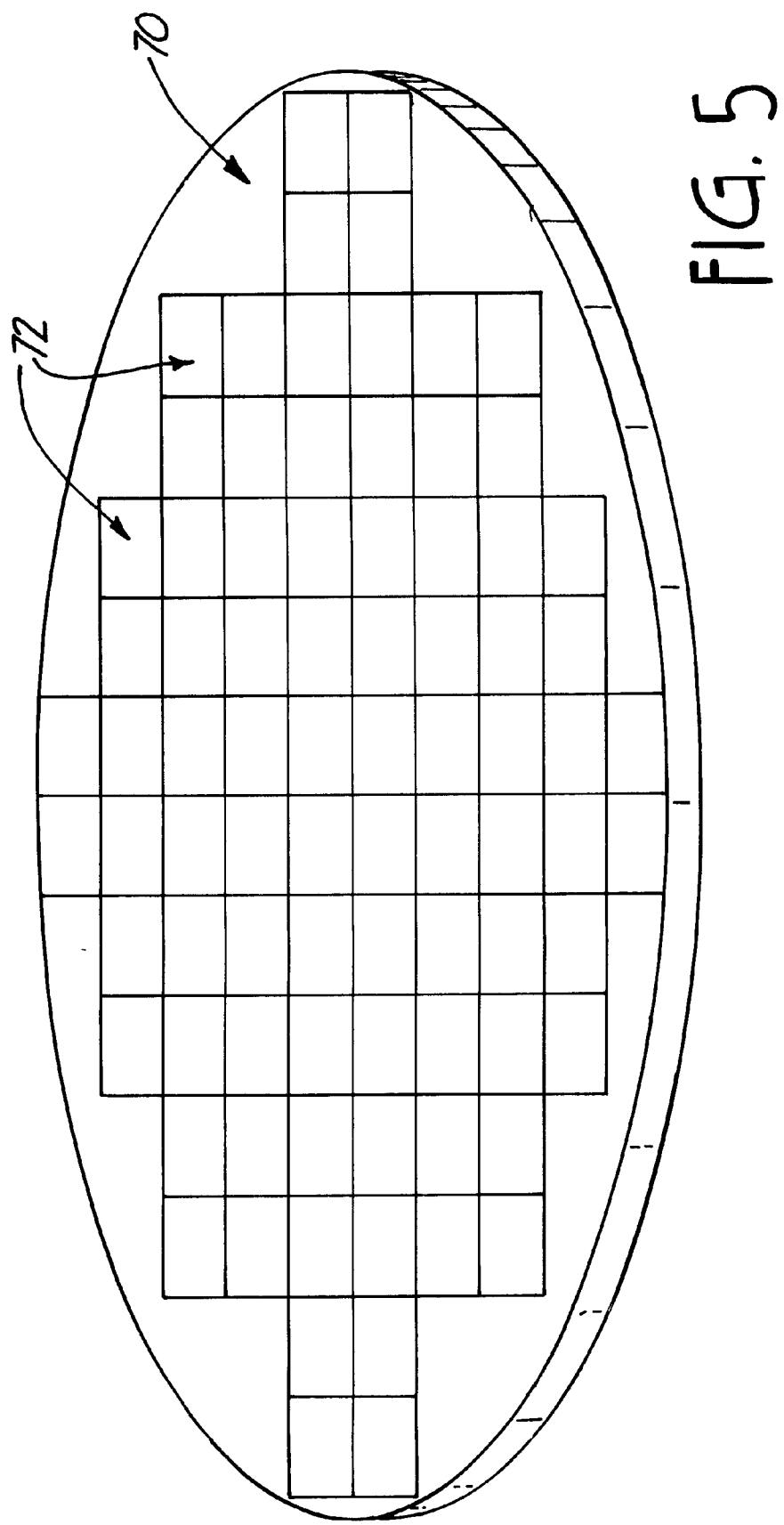
FIG. 5 is a perspective view of a product wafer including electrically isolated MEMS devices fabricated on the wafer according to a first embodiment of the present invention.

FIG. 5 is a perspective view of product wafer 70 including electrically isolated MEMS device structures 72 fabricated thereon according to a first embodiment of the present invention. Product wafer 70 has been thinned at each device location prior to fabrication of MEMS devices 72 using either anisotropic potassium hydroxide thinning (product wafer 82 in FIGS. 6a–6d and 7a–7d) or planar wafer thinning (product wafer 112 in FIGS. 8a–8f), for example, processes well known to the art. With these processes, product wafer 70 is left exposed at the back side (that is, the side opposite MEMS devices 72). This eliminates the problems (i.e., footing, added etch time, etc.) seen in the prior art examples when a wafer is bonded to the back side of product wafer 70, as will be described in further detail below.

Figure 6A:
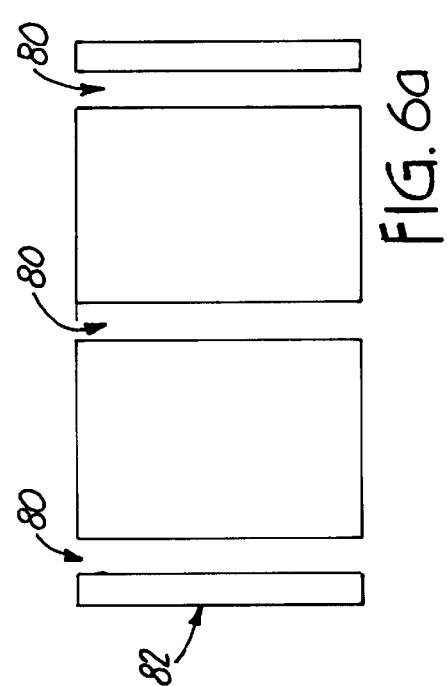
FIG. 6a is a cross-section view showing the first step of fabricating electrically isolated MEMS device structures according to a first embodiment of the present invention.

FIGS. 6a–6d show in cross-section the steps for fabricating electrically isolated MEMS device structures according to the first embodiment of the present invention. As a first step, shown in FIG. 6a, isolation trenches 80 are reactive-ion etched through product wafer 82. It should be noted that fabrication of uniformly straight-walled trenches 80 is readily achievable when a handle wafer is not bonded to the back side of product wafer 82, thereby eliminating the footing effect that was seen in the first prior art example (FIGS. 2a–2d).

Figure 6B:
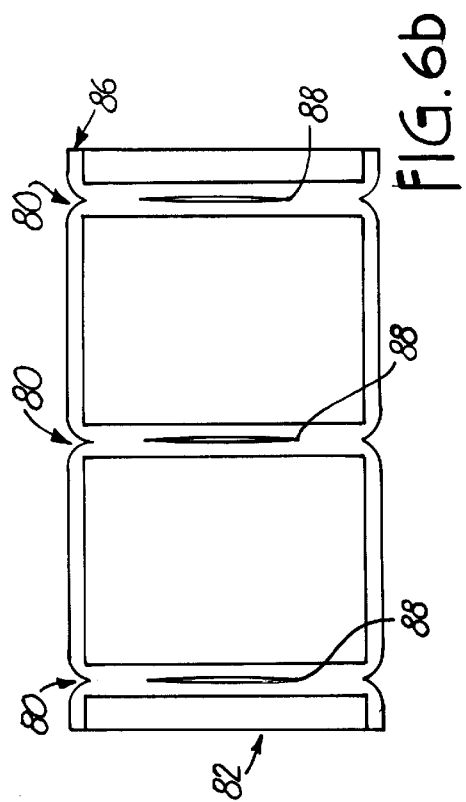
FIG. 6b is a cross-section view showing the second step of fabricating electrically isolated MEMS device structures according to a first embodiment of the present invention.

FIG. 6b shows the result of the step shown in FIG. 6a after isolation trenches 80 of product wafer 82 are filled with insulating material 86. Because product wafer 82 is left exposed on both sides, insulating material 86 is deposited from both sides of product wafer 82 and isolation trenches 80. As insulating material 86 is deposited, it builds up near the openings of isolation trenches 80>faster than in the middle of the trenches. Similar to the situation in the prior art examples, keyholes 88 form as isolation trenches 80 fill near the trench openings. However, because there is still a mechanical connection at both the top and bottom of isolation trenches 80, keyholes 88 are acceptably small. This added mechanical integrity is important to the functionality of the final MEMS device.

Figure 6C:
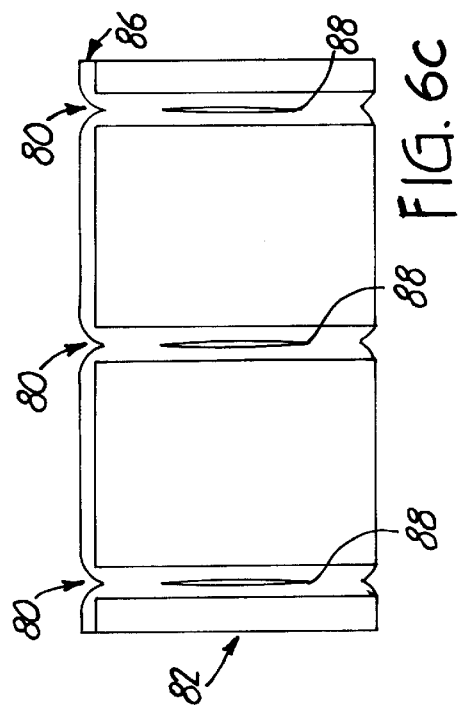
FIG. 6c is a cross-section view showing the third step of fabricating electrically isolated MEMS device structures according to a first embodiment of the present invention.

FIG. 6c shows the result of the step shown in FIG. 6b after etching insulating material 86 from the back side of product wafer 82. This process leaves the back side of product wafer 82 exposed. Etching the back side of product wafer 82 is readily achievable because no wafer is bonded to the back side of product wafer 82, thus allowing processing on both sides of the wafer. By etching insulating material 86 down to the back side of product wafer 82,devices fabricated on product wafer 82 will release immediately upon etching through product wafer 82. This is beneficial because silicon nitride, a material typically used for insulating material 86, requires a longer etch time than silicon. Furthermore, removing insulating material 86 from the back side of product wafer 82 eliminates potential adverse footing effects seen in the first prior art example (FIGS. 2a–d). However, this back side blanket etch of insulating material 86 removes some of the material from the bottom of isolation trenches 80. Although the removed insulating material is desired for mechanical strength, the impact on the mechanical integrity of the final device is acceptably small.

Figure 6D:
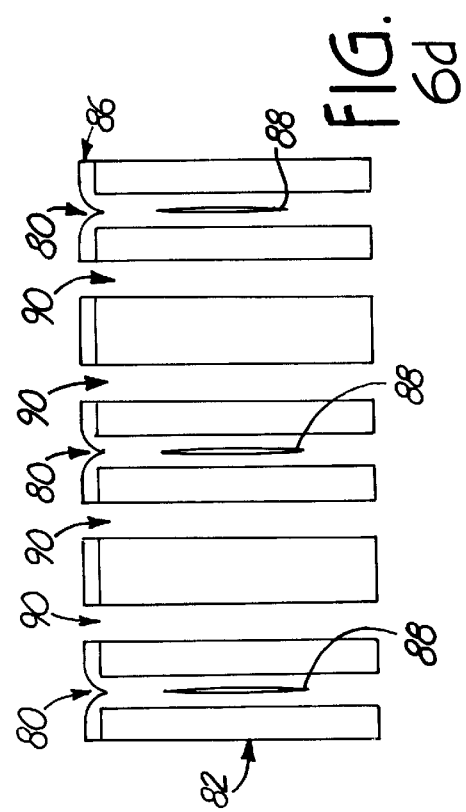
FIG. 6d is a cross-section view showing the fourth step of fabricating electrically isolated MEMS device structures according to a first embodiment of the present invention.

FIG. 6d shows the result of the step shown in FIG. 6c after etching trenches 90 defining high-aspect ratio MEMS structures through product wafer 82. As trenches 90 are etched through product wafer 82 they are released without any additional etching. This not only increases the efficiency of the MEMS device manufacturing process, but also maintains the straight-walled uniformity of both trenches 90 and isolation trenches 80.

To eliminate keyholes 88 of the first embodiment of the present invention (FIGS. 6a–6d), a second embodiment is set forth in FIGS. 7a–7d. In this embodiment, isolation trenches 100 are tapered from one side of product wafer 82 to the other (FIG. 7a). This solution is similar to that proposed to eliminate the keyholes of the prior art examples. However, since insulating material 104 deposits from both sides of product wafer 82, isolation trenches 100 do not have to be wider at the top. Rather, isolation trenches 100 can be wider at the bottom (FIG. 7b). This avoids the situation that occurs when isolation trenches 100 are wider at the top wherein etching on the portion of wafer 82 around the narrower trench bottom is prevented by the wider trench top. Consequently, this prevents slivers of silicon from being left unetched near the bottom of isolation trenches 100 after subsequent process steps, thus preventing short circuits in the final device. Next, insulating material 104 is removed from the back side of product wafer 82. As was seen in the first embodiment of the present invention (FIGS. 6a–6d); the blanket etch on the back side of product wafer 82 removes some of insulating material 104 from isolation trenches 100 (FIG. 7c). However, with the elimination of the keyhole in this embodiment, the strength loss from the back side blanket etch is insignificant. Finally, trenches 108 defining high-aspect MEMS device structures are etched through product wafer 82 (FIG. 7d). Because there is no handle wafer bonded to the back side of product wafer 82 and no insulation material 104 on the back side of product wafer 82, this last step releases the completed MEMS devices from product wafer 82.

FIGS. 8a–8f show a third embodiment of the present invention wherein planar thinned wafers are used for product wafer 112, rather than potassium hydroxide thinned wafers. Planar thinning, a process well known to the art, involves the use of an abrasive material (e.g., aluminum oxide) rather than reactive ions (e.g., potassium hydroxide)

to remove a portion of the wafer prior to fabrication of high-aspect ratio MEMS devices. An advantage of using planar thinned wafers over potassium hydroxide thinned wafers is that planar thinned wafers allow processing such as photopatterning and lapping on the back side as well as the front, etching side of product wafer 112. As a first step, to this embodiment, shown in FIG. 8a, isolation trenches 110 are reactive-ion etched through product wafer 112. Isolation trenches 10 are tapered from bottom to top so as to prevent formation of keyholes.

Next, a thin layer of insulating material 114 is deposited over wafer 112 and into isolation trenches 110 (FIG. 8b). It should be noted that, in this third embodiment, insulating material 114 does not fill isolation-trenches 110, but rather coats the inner walls of the trenches. This is because insulating material 114 is not used as the trench-fill material in this embodiment. However, insulating material 114 still serves to electrically isolate the final MEMS structures.

A trench-fill material 116, such as polysilicon, is then spread over insulating material 114, as shown in FIG. 8c. It is advantageous to use polysilicon to fill at least a portion of isolation trenches 110 because polysilicon deposits faster than silicon nitride (a material typically used for insulating material 114). Furthermore, the double deposition of insulating material 114 and polysilicon 116 is also well suited to use chemical mechanical polish (CMP) or normal lapping to planarize product wafer 112.

FIG. 8d shows the result of the step shown in FIG. 8c after lapping polysilicon 116 down to insulating layer 114, thus planarizing the top and bottom of product wafer 112 while leaving polysilicon 116 in isolation trenches 110. Using aluminum oxide as the abrasive material for lapping, with a Knoop hardness of 2100, the silicon, at a Knoop hardness of 850, will be readily removed. At the same time, the silicon nitride, at a Knoop hardness of 3490, will not be significantly attacked by the abrasive and will act as a stop.

Taking advantage of the photopatterning possible on the back side of product wafer 112, insulating material 114 on the bottom of product wafer 112 can be selectively removed, as shown in FIG. 8e. This method of removing insulating layer 114 is advantageous over the blanket etch method shown in FIG. 7c, in that it will increase the mechanical strength of trenches 118 defining high-aspect ratio MEMS device structures, especially when isolation trenches 110 are not tapered and a keyhole is present.

FIG. 8f shows the result of the step shown in FIG. 8e after trenches 118 have been reactive-ion etched through product wafer 112. Because insulating material 114 was selectively removed from the back side of product wafer 112 in the previous step, the etching of trenches 118 releases the completed MEMS devices from product wafer 112. This is advantageous over the prior art examples because no additional release step or etching is required to release the completed devices.

The present invention provides a method by which trenches that electrically isolate MEMS device structures are filled with insulating material in a novel fashion. Conventional methods of filling isolation trenches involve bonding a handle wafer to the back side of the product wafer. This not only requires added processing to release the handle wafer from the product wafer, but also only allows the isolation trenches to be filled from one side of the product wafer. Further, conventional methods of trench filling result in nonuniform filling, jeopardizing the mechanical integrity of the device. To remedy this, the present method provides means for filling isolation trenches from both sides of the product wafer by eliminating the use of a bonded handle wafer. In a first embodiment of the present invention, straight-walled isolation trenches are etched into a potassium hydroxide thinned wafer and are filled with insulating material from both sides of the wafer. This results in a keyhole that is acceptably small compared to the keyhole that is manifested using conventional filling methods. A second embodiment of the present invention also involves the use of a potassium hydroxide thinned wafer, but the trenches are tapered from one side of the wafer to the other. This eliminates the small keyhole that exists in the first embodiment, further increasing the mechanical integrity of the final device. In a third embodiment of the present invention, the product wafer is initially thinned using planar wafer thinning. After isolation trenches are etched through the wafer, they are first coated with a thin layer of insulating material. The trenches are then filled with a material such as polysilicon. This double deposition is more efficient than conventional single deposition techniques because the trench-fill material generally deposits faster than the insulating material. Furthermore, double deposition is well suited to use CMP or normal lapping to planarize the product wafer down to the insulating layer.

Although the present invention has been described with reference to preferred embodiments, workers skilled in the art will recognize that changes may be made in form and detail without departing from the spirit and scope of the invention.

What is claimed is:

1. A method for filling a trench extending through a microelectromechanical system (MEMS) device, the method comprising:

depositing a first trench-fill layer of insulating material over a first side of a wafer and into the trench, the wafer being employed for fabricating the MEMS device; and depositing, simultaneous with depositing the first trench-fill layer of insulating material over the first side of the wafer, a second trench-fill layer of insulating material over a second side of the wafer and into the trench such that the first trench-fill layer and the second trench-fill layer make a mechanical connection across the trench.

2. The method of claim 1, wherein the trench has a first width at the first side of the wafer equal to a second width at the second side of the wafer.

3. The method of claim 1, wherein the trench has a first width at the first side of the wafer narrower than a second width at the second side of the wafer.

4. The method of claim 1, further comprising:

depositing an insulating layer over the wafer and the trench prior to depositing the trench-fill layer, such that the insulating layer coats the first side of the wafer, the second side of the wafer, and all surfaces of the trench.

5. The method of claim 1, wherein the MEMS device is a disc drive microactuator.

6. A method for electrically isolating structures of a MEMS device on a wafer, the method comprising:

etching the wafer to form an electrical isolation trench extending through the wafer from a first side of the wafer to the second side of the wafer; and depositing a layer of insulating material over the first and second sides of the wafer and into the trench such that the insulating material makes a mechanical connection across the trench.

7. The method of claim 6, wherein the step of depositing a layer of insulating material over the first and second sides of the wafer and into the trench comprises:

depositing the layer of insulating material over the first side of a wafer and into the trench; and depositing the layer of insulating material over the second side of the wafer and into the trench simultaneous with depositing the layer of insulating material over the first side of the wafer and into the trench.

8. The method of claim 6, wherein the trench has a first width at the first side of the wafer equal to a second width at the second side of the wafer.

9. The method of claim 6, wherein the trench has a first width at the first side of the wafer narrower than a second width at the second side of the wafer.

10. The method of claim 6, further comprising:

depositing an insulating layer over the wafer and the trench prior to depositing the trench-fill layer, such that the insulating layer coats the first side of the wafer, the second side of the wafer, and all surfaces of the trench.

11. The method of claim 6, wherein the MEMS device is a disc drive microactuator.

12. A method for manufacturing a MEMS device on a wafer with a thickness determined by a patterned etch, the method comprising:

photopatterning a first side of the wafer to define boundaries of electrically insulated structures of the MEMS device;

etching through the wafer from the first side of the wafer to a second side of the wafer;

removing the photopattern from the first side of the wafer;

filling the trench by:

depositing a first trench-fill layer of insulating material over the first side of a wafer and into the trench; and depositing, simultaneous with depositing the first trench-fill layer of insulating material over the first side of the wafer, a second trench-fill layer of insulating material over the second side of the wafer and into the trench;

removing the insulating material from the second side of the wafer;

photopatterning the first side of the wafer to define high-aspect ratio MEMS device structures;

etching through the wafer from the first side of the wafer to the second side of the wafer to create the high-aspect ratio MEMS device structures; and removing the photopattern from the first side of the wafer.

13. The method of claim 12, wherein the trench has a first width at the first side of the wafer equal to a second width at the second side of the wafer.

14. The method of claim 12, wherein the trench has a first width at the first side of the wafer narrower than a second width at the second side of the wafer.

15. The method of claim 12, wherein the wafer is thinned using a potassium hydroxide backside tub etch technique.

16. The method of claim 12, wherein the wafer is initially thinned using a planar wafer thinning technique.

17. The method of claim 16, further including removing the insulating material from the first side of the wafer, prior to the step of photopatterning the first side of the wafer to define high-aspect ratio MEMS device structures.

18. The method of claim 17, further comprising:

depositing an insulating layer over the wafer and the trench prior to depositing the trench-fill layer, such that the insulating layer coats the first side of the wafer, the second side of the wafer, and all surfaces of the trench.

19. The method of claim 18, wherein the method further includes the step of etching a pattern through at least a portion of the protection layer on the second side of the wafer.

20. The method of claim 12, wherein the MEMS device is a disc drive microactuator.

* * * * *

UNITED STATES PATENT AND TRADEMARK OFFICE
CERTIFICATE OF CORRECTION

PATENT NO. : 6,593,163 B1
DATED : July 15, 2003
INVENTOR(S) : Wayne A. Bonin et al.

It is certified that error appears in the above-identified patent and that said Letters Patent is hereby corrected as shown below:

Column 5,
Line 24, after "trenches 66" insert -- . --

Column 7,
Line 6, delete "step," and insert -- step --.

Column 8,
Line 41, delete "across the trench" and insert -- across the full width of the trench at least in portions of the trench adjacent the first and second sides of the trench --.
Line 63, delete "across the trench" and insert -- across the full width of the trench at least in portions of the trench adjacent the first and second sides of the trench --.

Signed and Sealed this

Thirteenth Day of April, 2004

JON W. DUDAS
*Acting Director of the United States Patent and Trademark Office*